US006576961B1

(12) United States Patent
Gupta

(10) Patent No.: US 6,576,961 B1
(45) Date of Patent: Jun. 10, 2003

(54) SUBSTRATE RESISTANCE RING

(75) Inventor: Vikas I. Gupta, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/131,732

(22) Filed: Apr. 24, 2002

(51) Int. Cl.$^7$ ............................................. H01L 23/62
(52) U.S. Cl. ...................... 257/360; 257/357; 257/358; 257/363
(58) Field of Search ............................... 257/360, 269, 257/363, 365, 367, 29.141, 350, 355, 358

(56) References Cited

U.S. PATENT DOCUMENTS

| 4,987,465 | A | * | 1/1991 | Longcor et al. ............. 257/357 |
| 5,714,783 | A | * | 2/1998 | Duvvury ..................... 257/355 |
| 5,744,841 | A | * | 4/1998 | Gilbert et al. ............... 247/360 |
| 5,856,214 | A | * | 1/1999 | Yu ............................ 438/133 |
| 6,011,283 | A | * | 1/2000 | Lee et al. .................... 257/273 |
| 6,137,144 | A | | 10/2000 | Tsao et al. |
| 6,355,962 | B1 | * | 3/2002 | Liang et al. ................. 257/369 |
| 2001/0054740 | A1 | * | 12/2001 | Marr .......................... 257/360 |

FOREIGN PATENT DOCUMENTS

JP          10-92951         *  4/1998    ....... H01L/21/8238

OTHER PUBLICATIONS

E. Ajith Amerasekera, et al., "Electrostatic Discharge Device and Method" Ser. No. 09/456,036, Filed Dec. 3, 1999, TI–27748.

* cited by examiner

Primary Examiner—Jasmine J B Clark
(74) Attorney, Agent, or Firm—Rose Alyssa Keagy; W. James Brady, III; Frederick J. Telecky, Jr.

(57) ABSTRACT

An embodiment of the invention is a doped region within the silicon substrate 20 of an integrated circuit where the silicon substrate 10 separates the doped region into at least two sub-regions 40, 50. Another embodiment of the invention is a method of manufacturing an integrated circuit where any logic element is formed in a doped region. The doped region containing the logic element is separated into at least two sub-regions 40, 50 by the silicon substrate 10 of the integrated circuit.

42 Claims, 2 Drawing Sheets

SUBSTRATE RESISTANCE RING

BACKGROUND OF THE INVENTION

This invention relates to increasing the local substrate resistance of integrated circuits.

DETAILED DESCRIPTION OF THE INVENTION

A Substrate Resistance Ring ("SRR") increases the local substrate resistance of any logic element within an integrated circuit. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

Figure 1:
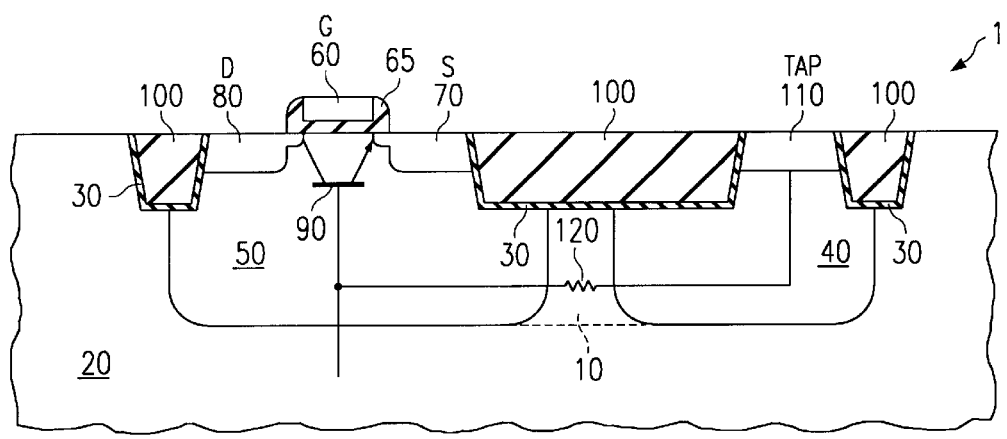
FIG. 1 shows the use of the Substrate Resistance Ring ("SRR") for an Electrostatic Discharge ("ESD") protection structure using an n-channel MOS ("NMOS") transistor.

In the best mode application, the Substrate Resistance Ring is used to improve the ESD protection of integrated circuits. Generally, ESD protection in integrated circuits is provided by either breakdown devices such as silicon controlled rectifiers ("SCRs") and NMOS transistors (which function as parasitic lateral npn bipolar transistors), or by non-breakdown devices such as diodes. Referring to the drawings, FIG. 1 depicts a ESD protection structure, labeled 1, which contains an SRR 10. The SRR could be used in any type of technology, for instance in CMOS or bipolar. Using CMOS as an example technology, the SRR portion of the wafer is shown in FIG. 1 as the region bounded by the oxide liner 30, the dopant regions 40 and 50, and the dashed line. Physically, the SRR 10 is the same material as the starting material of the wafer 20.

For the best mode application the dopant regions 40 and 50 are retrograde p-well regions. Therefore, p-wells 40 and 50 have 'p' dopants. Furthermore, in this example the starting material 20 has 'p−' dopants. Contained within the p-well 50 is a NMOS transistor created by gate 60, source 70 and drain 80. In this example, source 70 and drain 80 have 'n+' dopants. The NMOS gate is created from polysilicon 60 and gate oxide 65. This NMOS transistor is used to provide ESD protection to the integrated circuit when the NMOS transistor is in breakdown mode and therefore acting as a parasitic bipolar transistor. A parasitic npn bipolar transistor is commonly created from the diffusions of CMOS transistors. In the specific example shown in FIG. 1 the parasitic lateral npn bipolar transistor 90 is formed from source 70, drain 80 and well diffusion 50. Drain 80 acts as the "collector", the source 70 acts as the "emitter", and will diffusion 50 acts as the "base". The "collector", "emitter", and "base" refer to the terminals of the parasitic bipolar transistor 90.

To complete this example application of FIG. 1, there is oxide 100 contained within the oxide liner 30; together they create the shallow trench isolation ("STI"). Tap 110 is a region of 'p+' dopants and facilitates the biasing of the NMOS transistor. Starting material 20 may be one of two types: 1. a non-EPI (non-epitaxy) substrate where the entire starting material is of uniform doping concentration, or 2. an EPI substrate which consists of a high resistivity single crystal layer epitaxially grown on top of a low resistivity substrate. This invention is applicable to both types of starting materials.

The SRR 10 enhances the effective substrate resistance of the ESD protection structure 1 by adding the resistance 120 to the ESD protection structure (without the SRR, the region of the ESD structure that is labeled 10 would be comprised of the same lower resistance 'p'dopant material as the p-wells 40 and 50). As a result, the presence of SRR 10 will improve the second breakdown current level ($I_{t2}$) of ESD protection structure 1 compared to an ESD protection structure not containing a SRR 10.

Figure 2:
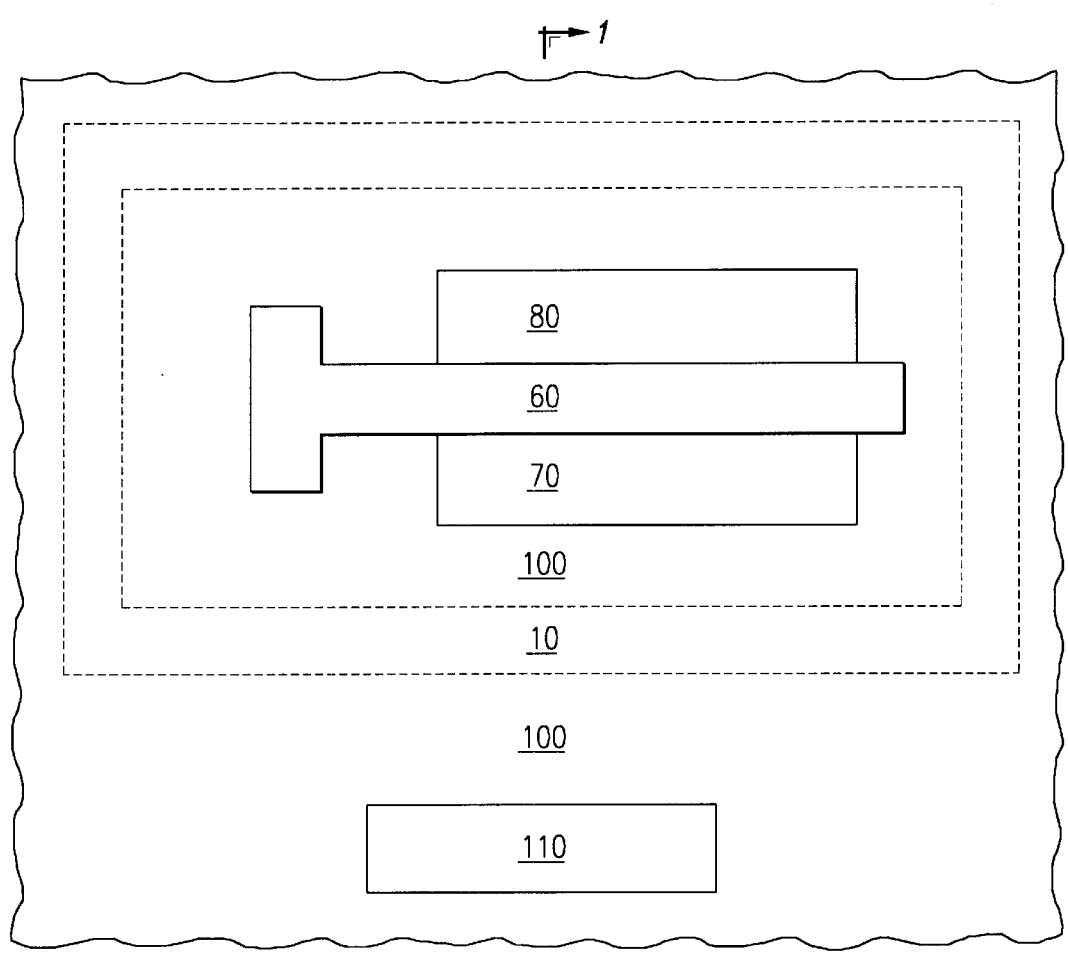
FIG. 2 shows the ESD protection structure of FIG. 1 from a different angle.

As shown in FIG. 2, the SRR 10 is a ring shape in the best mode application. FIG. 2 shows the example ESD protection structure of FIG. 1 from a different angle. Specifically, FIG. 2 shows the integrated circuit device as viewed from above the wafer. (The viewing angle of FIG. 1 is marked on FIG. 2.) In the best mode application the SRR is a ring because a breakdown current would be expected to flow in all directions within the ESD protection structure 1 during an ESD event. However, other shapes for the SRR are contemplated in this invention (i.e. square, circle, oval, triangle, etc.). In fact, the SRR doesn't need to be a continuous structure; rather, it is possible that the best SRR shape for a given circuit design is a non-continuous structure such as dashes, parallel bars, or a horseshoe shaped region.

In the best mode application the width the SRR is 2 $\mu$m with the distance of the SRR 10 from the source 70 or drain 80 of 4 $\mu$m. This best mode SRR dimension provides the most amount of improvement in $I_{t2}$ with the least amount of SRR area; thus reducing product costs by minimizing the amount of real estate needed on the die for optimal ESD protection.

The SRR structure described has an effective substrate resistance level of approximately 450 to 485 ohms for CMOS devices using 1.5V or 1.8V CMOS technology in a 2 ohm-cm non-EPI starting material. This results in an increase in $I_{t2}$ to approximately 6.7 mA/m$\Omega$ (from 4.7 mA/m$\Omega$ for 1.5V technology and 4.1 mA/m$\Omega$ for 1.8V technology)—an improvement of approximately 150% for the best mode application. This improvement in secondary breakdown current performance means that the ESD protection structure that contains the SRR can withstand more severe ESD events (i.e. larger drain voltages) before irreversible device failure occurs (i.e. physical melting caused by excessive current flow).

Figure 3:
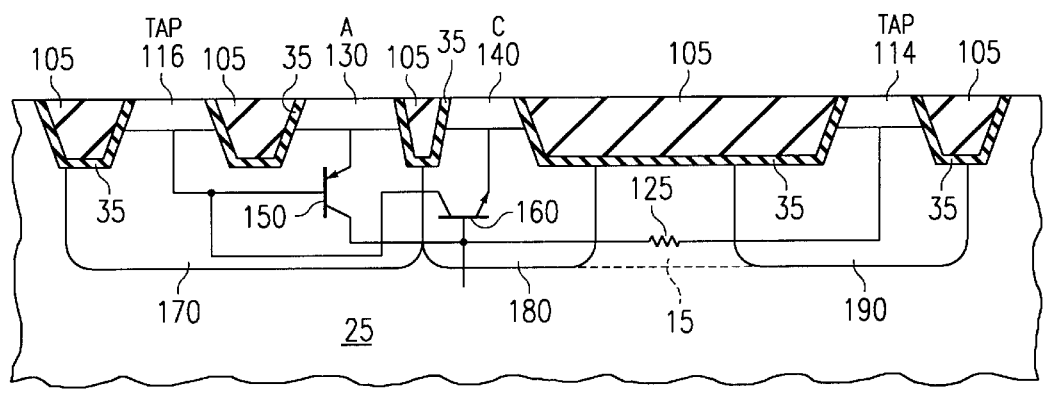
FIG. 3 shows the use of the SRR for an ESD protection structure using silicon controlled rectifiers ("SCRs").

FIG. 3 shows the use of the SRR in applications that use silicon controlled rectifiers in breakdown mode for ESD protection. FIG. 3 is a cross-sectional diagram of a CMOS inverter. Superimposed on the inverter are two parasitic bipolar transistors formed from source and well diffusions; one is a vertical pnp 150 and the other a lateral npn 160. These transistors form a npnp structure, or silicon controlled rectifier, between the taps (supply terminals) 114 and 116. In normal operation the SCR is in an unlatched or high resistance state (the OFF state) but it can be triggered into a latched or low resistance state (the ON state) by currents flowing laterally across the emitter-base regions or the parasitic bipolar transistors 150 and 160. These currents forward bias the emitter-base junctions and turn the transistors on. When a transistor turns on, its collector current acts as the base current for the other transistor, creating positive feedback between them.

To complete the description of the example application shown in FIG. 3, region 130 is an anode that is doped p+. Terminal 114 is also doped p+ and forms a substrate/p-well tap. Region 140 is a cathode that is doped n+. Terminal 116 is also doped n+ and forms the n-well tap. Regions 180 and 190 are p-wells, while region 170 is an n-well. Similar to FIG. 1, regions 35 and 105 form the STI features and region 25 is the starting material.

In FIG. 3, the SRR is the area labeled 15, which is bounded by p-wells 180 and 190, the oxide liner 35, and the dashed line. The SRR region 15 is made up of the same material as the starting material 25, thereby adding resistance 125 to the circuit. Similar to the best mode application shown in FIG. 1, the presence of SRR 15 increases the effective substrate resistance; and therefore, decreases the trigger current level of the ESD protection structure that contains the SRR 10.

Figure 4:
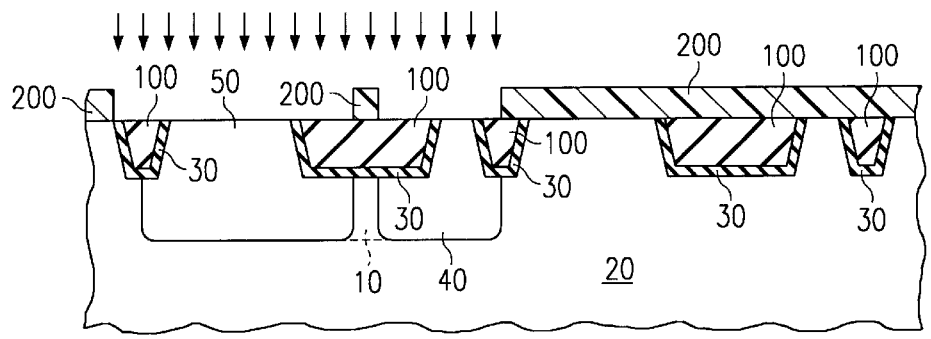
FIG. 4 shows the manufacturing process that creates the SRR.

FIG. 4 shows the best mode method for creating the SRR 10 in a CMOS device that uses NMOS transistors as the ESD protection structure. This same method could be used to create the SRR anywhere on the integrated circuit, including the ESD protection structures containing SCRs as shown in FIG. 3. Moreover, ESD protection structures can be created in either NMOS or p-channel MOS ("PMOS").

In the best mode example, the ESD protection structure is formed in an NMOS region. Before the manufacturing stage shown in FIG. 4, the wafer has proceeded through some standard manufacturing steps. For example, the EPI (if desired) is deposited on the substrate material to create the starting material 20 (otherwise, the starting material 20 is only the substrate). Next, the oxide features are created, possibly by etching the desired STI pattern into the starting material 20, forming the oxide liner 30, and then filling the liners 30 with oxide 100.

FIG. 4 shows the best mode process of creating the SRR structure 10 during the creation of the p-well structures. As shown in FIG. 4, photoresist 200 (which is formed using a single reticle) blocks the implantation of p-type dopants in the selected SRR location, 10, during the creation of the p-well, the threshold voltage adjust, the punch-through, and channel stop regions (all of which are formed during the same mask step). The presence of photoresist 200 over the area 10 creates the SRR 10 that is formed by starting material 20 by blocking the implantation of n-type dopants in the location of the SRR. 10.

During the manufacturing stage where the ESD protection structures are created, the rest of the p-well core transistors are generally also created (i.e. no additional mask levels are used). However, the local substrate resistance of the core logic transistors is not impacted (increased) when the photoresist pattern used in the locations of the core design transistors does not create SRR structures in the retrograde p-wells of those core transistors.

After the implantation process that creates the SRR, the photoresist 200 is removed and another photoresist layer that fully covers the p-well features is deposited. At this point the n-well features, such as the rest of the core transistors for the designed circuit, are created.

While various embodiments of the present invention have been described above, it should be understood that they have been presented by way of example only, and not limitation.

Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit comprising:
   a silicon substrate;
   a first doped region formed within said silicon substrate, said first doped region containing a logic element; and
   a second doped region formed within said silicon substrate, said second doped region containing a tap, said first and second doped regions separated by said silicon substrate.

2. The integrated circuit of claim 1, wherein said first doped region is completely enclosed by said silicon substrate.

3. The integrated circuit of claim 1, wherein the effective substrate resistance of said logic element contained in said first doped region is increased.

4. An integrated circuit comprising:
   a silicon substrate;
   a first doped region formed within said silicon substrate, said first doped region containing an ESD structure; and
   a second doped region formed within said silicon substrate, said second doped region containing a tap, said silicon substrate dividing said first and second doped regions.

5. The integrated circuit of claim 4 wherein the effective substrate resistance of said ESD structure contained in said first doped region is increased.

6. The integrated circuit of claim 4 wherein the second breakdown current of said ESD structure contained in said first doped region is increased.

7. The integrated circuit of claim 4, wherein said ESD structure is a transistor.

8. The integrated circuit of claim 4, wherein said ESD structure is a silicon controlled rectifier.

9. An integrated circuit comprising:
   a silicon substrate;
   a first doped region formed within said silicon substrate, said first doped region containing an ESD structure; and
   a second doped region formed within said silicon substrate, said second doped region containing a tap, said silicon substrate dividing said first and second doped regions and thereby increasing the second breakdown current of said ESD structure.

10. The integrated circuit of claim 9, wherein said ESD structure is a transistor.

11. The integrated circuit of claim 9, wherein said ESD structure is a silicon controlled rectifier.

12. An integrated circuit comprising:
   a silicon substrate;
   a first doped region formed within said silicon substrate, said first doped region containing an ESD structure; and
   a second doped region formed within said silicon substrate, said second doped region containing a tap, said silicon substrate dividing said first and second doped regions and thereby increasing the effective substrate resistance of said ESD structure.

13. The integrated circuit of claim 12, wherein said ESD structure is a transistor.

14. The integrated circuit of claim 12, wherein said ESD structure is a silicon controlled rectifier.

15. An integrated circuit comprising:
a silicon substrate;
a first doped region formed within said silicon substrate, said first doped region containing an ESD structure; and
a second doped region formed within said silicon substrate, said second doped region containing a tap, said first and second doped regions separated by said silicon substrate.

16. The integrated circuit of claim 15, wherein said first and second doped regions are n-wells.

17. The integrated circuit of claim 15, wherein said first and second doped regions are p-wells.

18. The integrated circuit of claim 15, wherein said ESD structure is a transistor.

19. The integrated circuit of claim 15, wherein said ESD structure is a silicon controlled rectifier.

20. The integrated circuit of claim 15, wherein said first doped region is completely enclosed by said silicon substrate.

21. A method of manufacturing an integrated circuit comprising:
forming a first and second doped region within a silicon substrate; and
forming an ESD structure within said first doped region, wherein said silicon substrate divides said first and second doped regions.

22. The method of claim 21, wherein said ESD structure is a silicon controlled rectifier.

23. The method claim 21, wherein said first doped region is completely enclosed by said silicon substrate.

24. A method of manufacturing an integrated circuit comprising:
forming a first and second doped region within a silicon substrate; and
forming an ESD structure within said first doped region and forming a tap within said second doped region, wherein the second breakdown current of said ESD structure is increased by using said silicon substrate to divide said first and second doped regions.

25. The method of claim 24 wherein said first doped region is completely enclosed by said silicon substrate.

26. A method of manufacturing an integrated circuit comprising:
forming a first and second doped region within a silicon substrate; and
forming an ESD structure within said first doped region and forming a tap within said second doped region, wherein the effective substrate resistance of said ESD structure is increased by using said silicon substrate to divide said first and second doped regions.

27. The method of claim 26 wherein said first doped region is completely enclosed by said silicon substrate.

28. A method of manufacturing an integrated circuit comprising:
forming an ESD structure within a first doped region of a silicon substrate, said silicon substrate having said first doped region and a second doped region that are separated by said silicon substrate for increasing said ESD structure's breakdown current.

29. A method of manufacturing an integrated circuit comprising:
forming an ESD structure within a first doped region of a silicon substrate, said silicon substrate having said first doped region and a second doped region that are separated by said silicon substrate for increasing said ESD structure's effective substrate resistance.

30. A method of manufacturing an integrated circuit comprising:
forming a transistor within a first doped region of a silicon substrate to create an ESD structure, said first doped region being separated from a second doped region containing a tap, said separation containing said silicon substrate for increasing said ESD structure's second breakdown current.

31. A method of manufacturing an integrated circuit comprising:
forming a silicon controlled rectifier within a first doped region of a silicon substrate to create an ESD structure, said first doped region being separated from a second doped region containing a tap, said separation containing said silicon substrate for decreasing said ESD structure's trigger current.

32. A method of manufacturing an integrated circuit comprising:
forming a transistor within a first doped region of a silicon substrate to create an ESD structure, said first doped region being separated from a second doped region containing a tap, said separation containing said silicon substrate.

33. The method of claim 32 wherein said first doped region is completely enclosed by said silicon substrate.

34. A method of manufacturing an integrated circuit comprising:
forming a silicon controlled rectifier within a first doped region of a silicon substrate to create an ESD structure, said first doped region being separated from a second doped region containing a tap, said separation containing said silicon substrate.

35. The method of claim 34 wherein said first doped region is completely enclosed by said silicon substrate.

36. A method of manufacturing an integrated circuit comprising:
forming a NMOS transistor within a first doped region of a silicon substrate to create an ESD structure, said first doped region being separated from a second doped region containing a tap, said separation containing said silicon substrate.

37. A method of manufacturing an integrated circuit comprising:
forming a PMOS transistor within a first doped region of a silicon substrate to create an ESD structure, said first doped region being separated from a second doped region containing a tap, said separation containing said silicon substrate.

38. A method of manufacturing an integrated circuit comprising:
forming a first and second doped region within a silicon substrate; and
forming a logic element within said first doped region and forming a tap within said second doped region, wherein said silicon substrate divides said first and second doped regions.

39. A method of manufacturing an integrated circuit comprising:
forming a first and second doped region within a silicon substrate; and forming a logic element within said first doped region and forming a tap within said second doped region, wherein the second breakdown current of said logic element is increased by using said silicon substrate to divide said first and second doped regions.

40. A method of manufacturing an integrated circuit comprising:

forming a first and second doped region within a silicon substrate; and forming a logic element within said first doped region and forming a tap within said second doped region, wherein the effective substrate resistance of said logic element is increased by using said silicon substrate to divide said first and second doped regions.

41. A method of manufacturing an integrated circuit comprising:

forming a logic element within first doped region of a silicon substrate, said silicon substrate having said first doped region and a second doped region containing a tap; and simultaneously forming a ring of said silicon substrate around said first doped region, said ring also forming a separation between said first doped region and said second doped region.

42. The method of claim 41 wherein said ring is shaped as a rectangle.

* * * * *